United States Patent [19]
Lindstrum

[11] 3,983,501
[45] Sept. 28, 1976

[54] HYBRID TRACKING LOOP FOR DETECTING PHASE SHIFT KEYED SIGNALS

[75] Inventor: Alan L. Lindstrum, Port Blakely, Wash.

[73] Assignee: The United States of America as represented by the Secretary of the Navy, Washington, D.C.

[22] Filed: Sept. 29, 1975

[21] Appl. No.: 617,885

[52] U.S. Cl.................................. 329/122; 325/349; 325/419; 329/136; 331/17
[51] Int. Cl.² ........................................ H03D 3/00
[58] Field of Search................. 329/122, 124, 136; 331/17, 23; 325/320, 349, 419

[56] References Cited
UNITED STATES PATENTS

| | | | |
|---|---|---|---|
| 3,753,114 | 8/1973 | Burley............................. | 329/122 X |
| 3,883,806 | 5/1975 | DeLong et al................. | 329/124 X |
| 3,906,376 | 9/1975 | Bass............................... | 329/122 X |

*Primary Examiner*—Siegfried H. Grimm
*Attorney, Agent, or Firm*—R. S. Sciascia; Charles D. B. Curry

[57] ABSTRACT

A hybrid tracking loop detector system that accurately demodulates phase shift keyed acoustic telemetry signals. The system internally determines the received carrier frequency and detects phase shifts that denote the digital format depicted by the phase shift keyed signals. The system is particularly useful for operating at low signal to noise ratios and with relatively short messages. The detector includes a phase lock loop comprising a phase comparator, an amplifier, an adjustable filter and a voltage controlled oscillator. The phase and frequency of the oscillator are divided and are locked to the carrier frequency of the received signal and are used as a reference for the phase comparison detection. The system has two sequenced modes of operation, a direct acquisition mode and a holding mode. The detector switches automatically from the direct acquisition mode to the holding mode. The filter is initially broadband to allow detection of doppler shifted carrier signals and after locking onto the carrier signal it is switched to a narrow bandwidth to permit detection of low signal to noise ratio signals. A switching circuit is also provided to eliminate cycle slipping or loss of lock during periods when there is a phase shift in the received signals.

10 Claims, 6 Drawing Figures

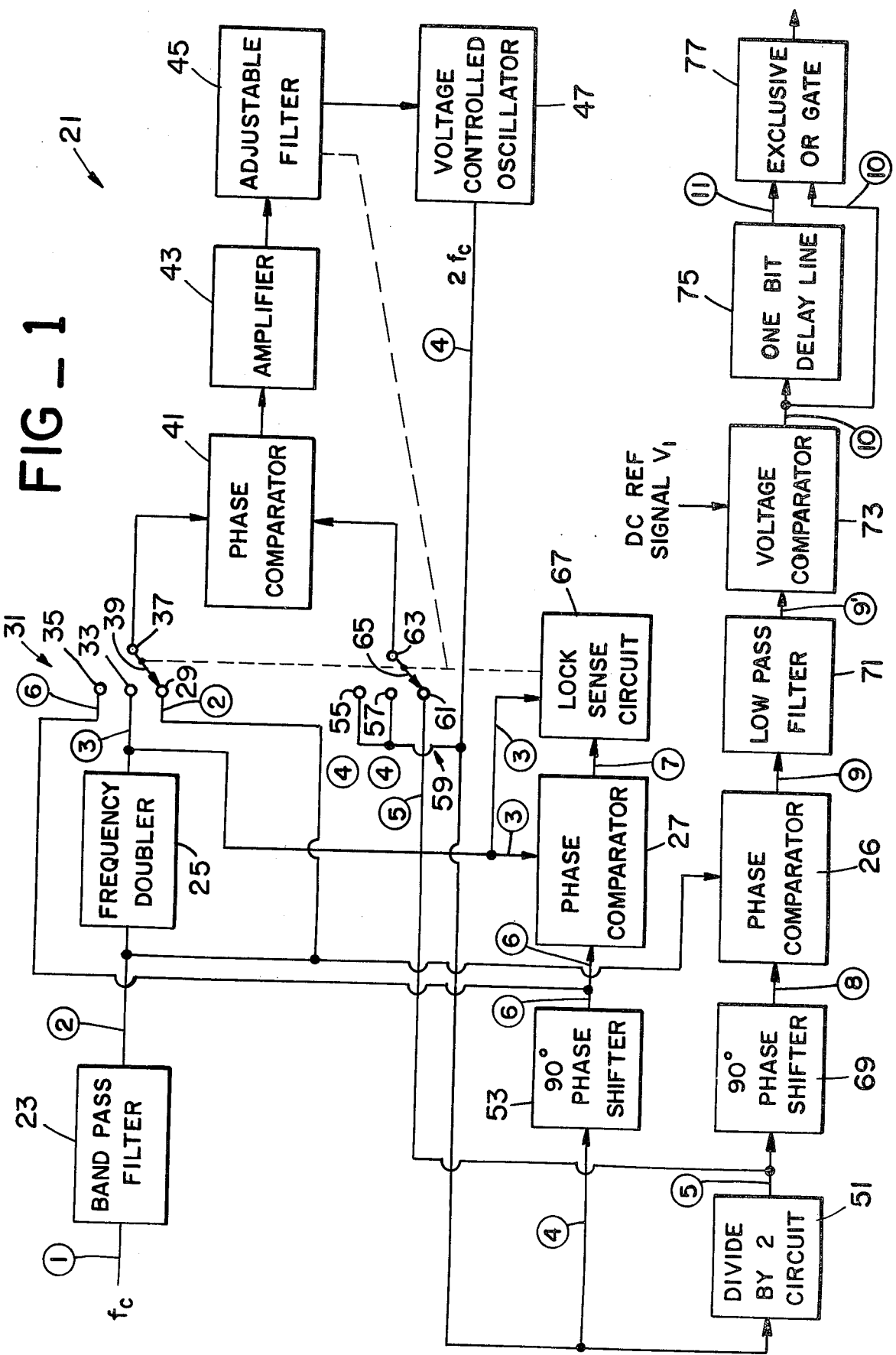

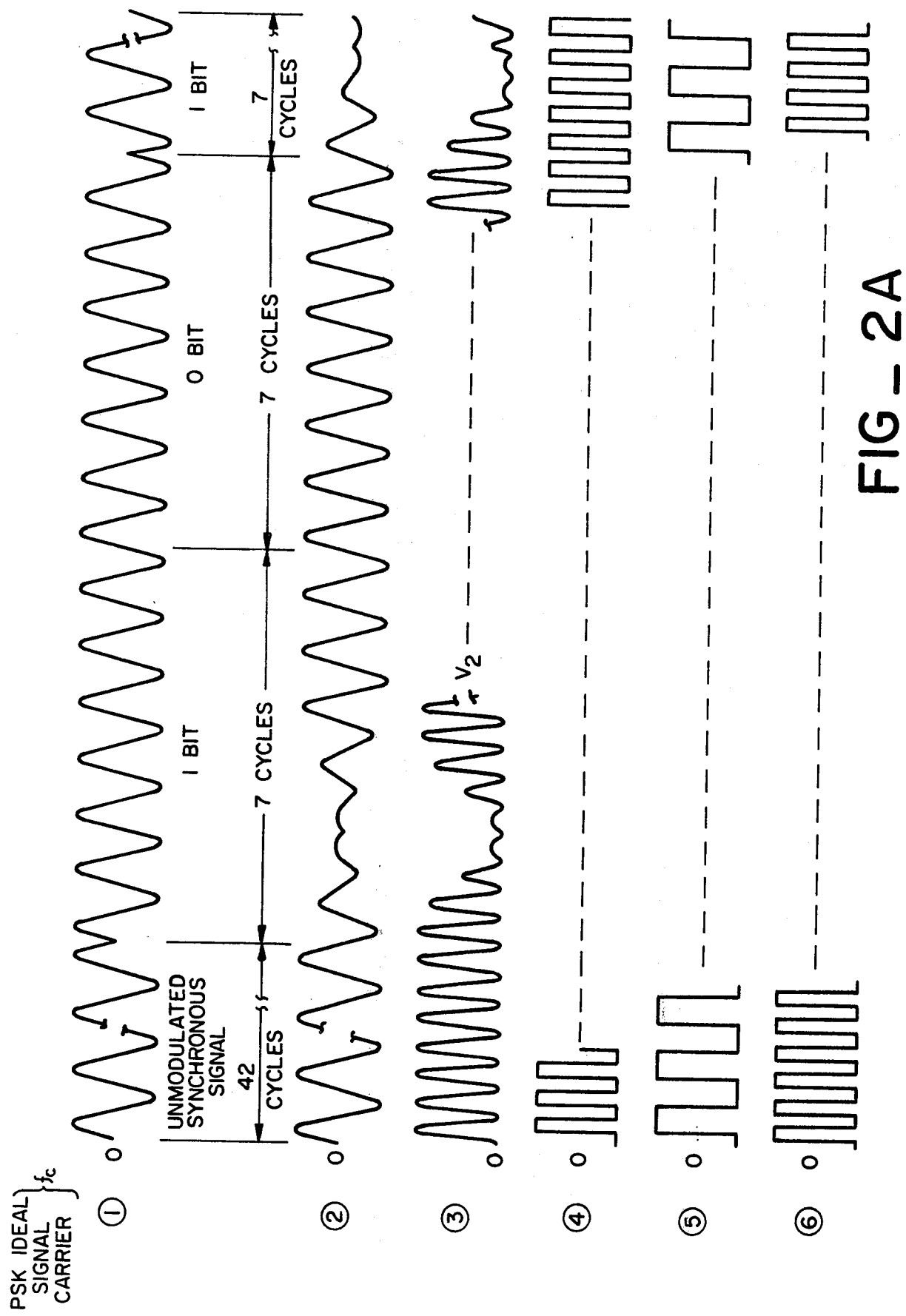
FIG_2A

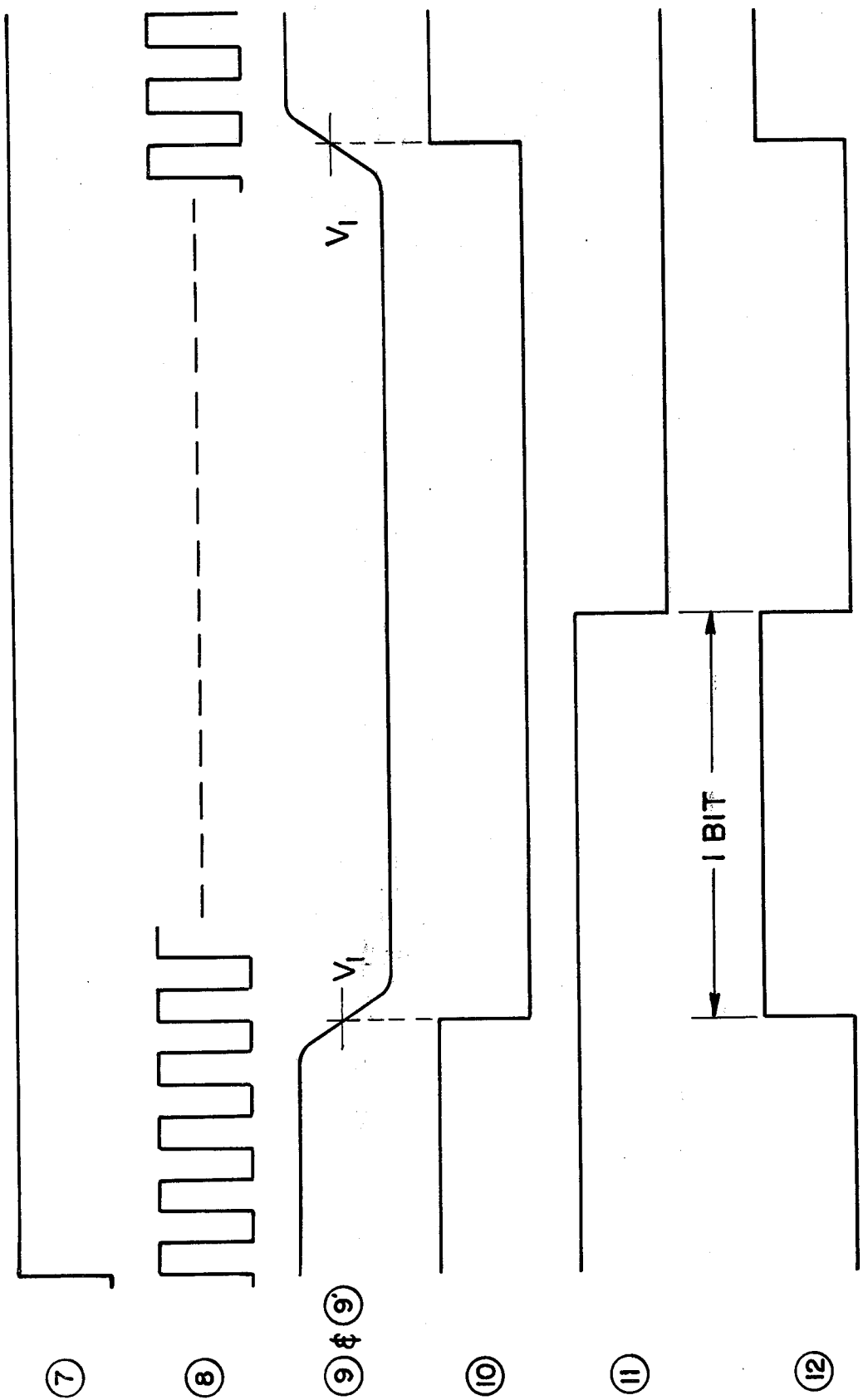

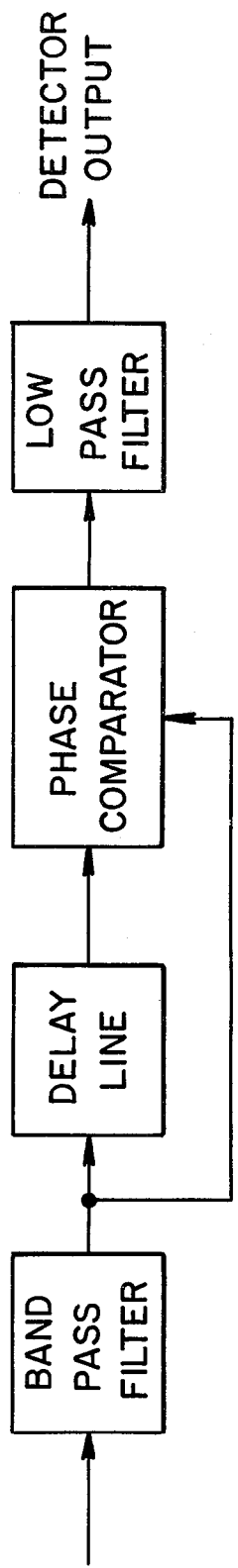
FIG_3 DIFFERENTIAL DETECTOR (PRIOR ART)
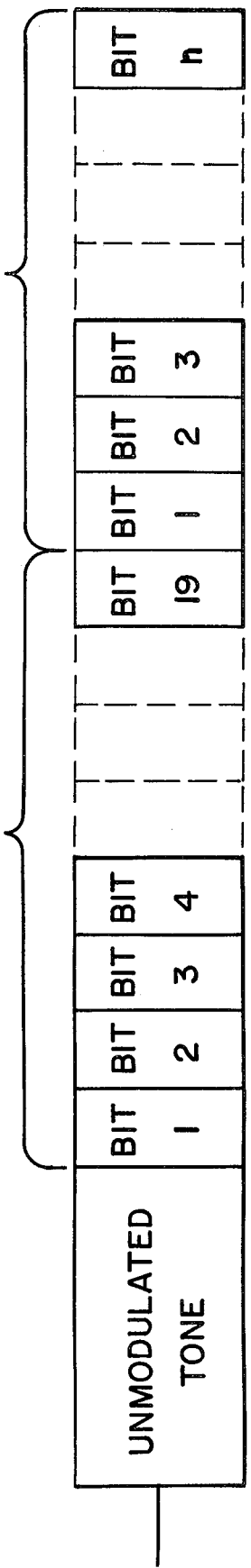
FIG_4

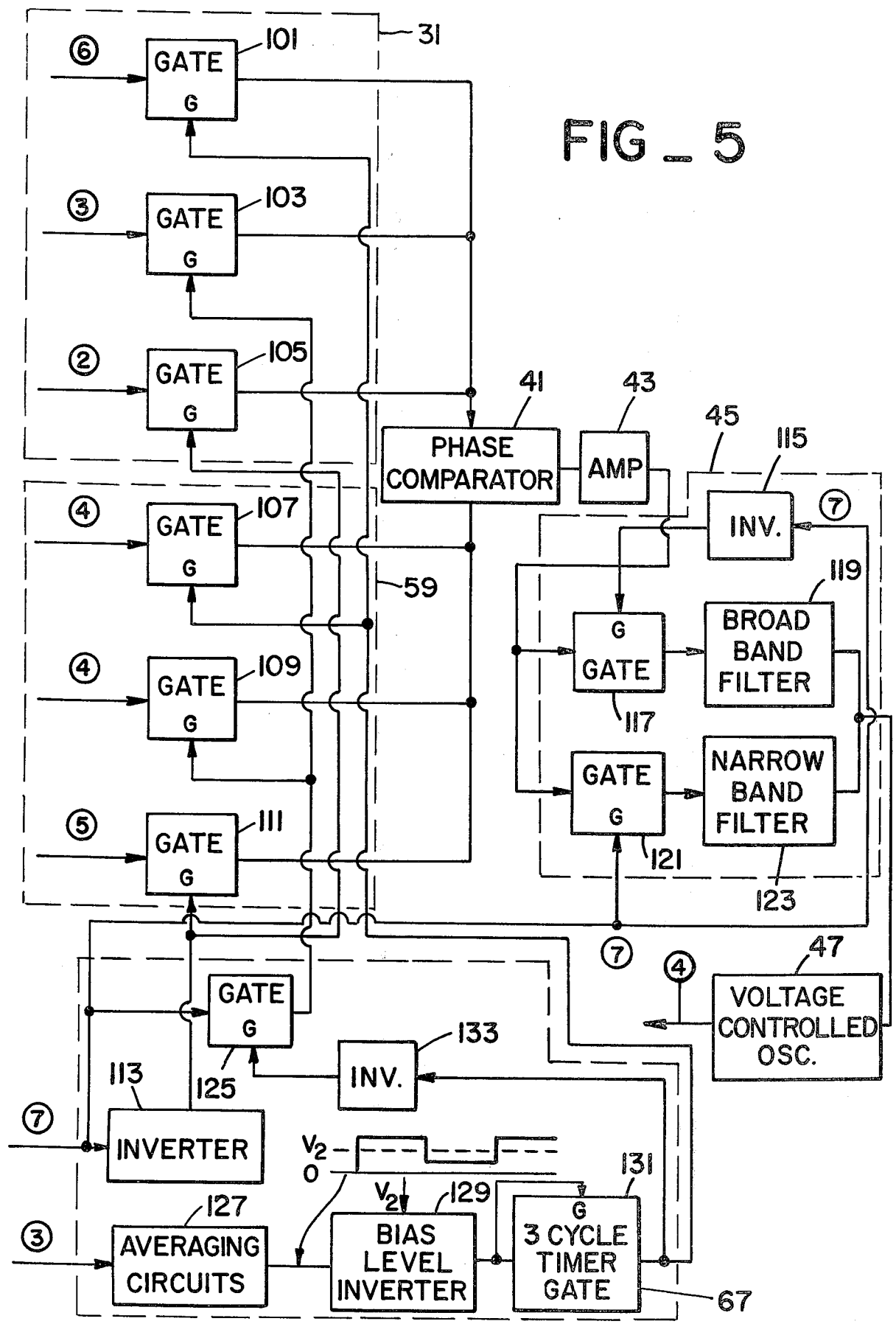
FIG _ 5

HYBRID TRACKING LOOP FOR DETECTING PHASE SHIFT KEYED SIGNALS

BACKGROUND OF THE INVENTION

1. Field of the Invention

The present invention relates to a detection system and more particularly to a hybrid tracking loop detector system for demodulation of phase shift keyed messages into their coded digital format.

2. Description of the Prior Art

Prior methods for demodulating phase shift keyed messages when frequency and phase are not known at the receiver have included differential detection. In differential detection the phase of a binary bit having a duration of seven periods of the carrier frequency, for example, is compared with the preceding bit in a phase detector. In this system the binary zero is defined, for example, as the phase relationship of 0° ± 90° between adjacent bits and a binary one as 180° ± 90°. This detection method works well if the delay line length is precisely equal to the received bit length. However, if the received frequency is shifted by an unknown amount the bit length will not match the delay line length. This may be caused by, for example, a large doppler effect as would occur with acoustic telemetry signals transmitted through the water from a high speed vehicle. At doppler shifts of greater than ± 1% the resultant phase error seriously reduces the signal-to-noise ratio at the output of the detector, thereby degrading the probability of correct detection.

The present invention overcomes these disadvantages by providing a hybrid tracking loop detection system that operates at very low signal-to-noise ratios and eliminates cycle slipping when there are phase shifts in the received signals.

Summary of the Invention

Briefly, the present invention comprises a hybrid tracking loop detector system that accurately demodulates phase shift keyed acoustic telemetry signals. The system internally determines the received carrier frequency and detects phase shifts that denote the digital format depicted by the phase shift keyed signals. The system is particularly useful for operating at low signal to noise ratios and with relatively short messages. The detector includes a phase lock loop comprising a phase comparator, an amplifier, an adjustable filter and a voltage controlled oscillator. The phase and frequency of the oscillator are divided and are locked to the carrier frequency of the received signal and are used as a reference for the phase comparison detection. The system has two sequented modes of operation, a direct acquisition mode and a holding mode. The detector switches automatically from the direct acquisition mode to the holdling mode. The filter is initially broadband to allow detection of doppler shifter carrier signals and after locking onto the carrier signal it is switched to a narrow bandwidth to permit detection of low signal to noise signals. A switching circuit is also provided to eliminate cycle slipping or loss of lock during periods when there is a phase shift in the received signals.

Statement of the Objects of the Invention

An object of the present invention is to provide a reliable detector system of phase shift keyed signals.

Another object of the present invention is to provide a detector system of phase shift keyed signals having a low signal-to-noise ratio.

Still another object of the present invention is to provide a detector system of phase shift keyed signals that prevent cycle slipping of the phase lock detector.

A further object of the present invention is to provide a detector system of phase shift keyed signals that locks onto the carrier frequency of the phase shift keyed signals.

A still further object of the present invention is to provide a detector system of phase shift keyed signals that employs a broad bandwidth filter to allow phase lock onto doppler shifted signals and a narrow bandwidth to allow detection of signals having a low signal-to-noise ratio.

Other objects, advantages and novel features of the invention will become apparent from the following detailed description of the invention when considered in conjunction with the accompanying drawings wherein:

BRIEF DESCRIPTION OF THE DRAWINGS

FIG. 1 is a block diagram of the hybrid tracking loop detector system of the present invention;

FIGS. 2A and 2B together comprise a signal diagram illustrating the operation of the detector system of FIG. 1;

FIG. 3 is a block diagram of a conventional differential detector;

FIG. 4 is a diagram illustrating one type of phase shift keyed message format that may be received by the detector system of FIG. 1; and FIG. 5 is a schematic diagram illustrating the details of the switching circuits, the lock sense circuit and the adjustable filter circuit of the detector system of FIG. 1.

DESCRIPTION OF THE PREFERRED EMBODIMENT

In FIG. 1 is illustrated by block diagram the hybrid tracking loop detector system 21 of the present invention. In FIGS. 2A and 2B is illustrated a signal diagram for the purpose of explaining the operation of the hybrid tracking loop detector system 21 shown in FIG. 1. The signals at the various points within the detector 21 are indicated by circled reference numerals in FIG. 1 which correspond to circled reference numerals in the signal diagram of FIGS. 2A and 2B.

Referring to FIG. 1, the hybrid tracking detector 21 is an electronic system which demodulates (detects) phase shift keyed (PSK) acoustic telemetry signals, for example. The present invention provides a technique for demodulating the received PSK signals when the frequency and the phase of the received PSK signals are not known at the detector 21. The present invention internally determines the frequency and phase, and the corresponding digital equivalent, of the received PSK signals and has been found to be especially useful when the incoming signal-to-noise ratio is low, when the messages are short, and when doppler shift becomes a significant factor.

In FIG. 3 is illustrated a typical prior method for demodulating short PSK messages when frequency and phase are not known at the receiver. This method is referred to as differential detection wherein the phase of a binary bit, having a duration of seven periods of the carrier frequency, for example, is compared with the preceding bit in a phase detector. A binary zero may be defined, for example, as a phase relationship of 0° ± 90° between adjacent bits and a binary one as 180° ± 90°. This detection method works well if the delay line length is precisely equal to the received bit length. However, if the received frequency is shifted by an unknown amount the bit length will not match the delay line length. This may be caused by, for example, a large doppler effect as would occur with acoustic telemetry signals transmitted through the water from a high speed vehicle. At doppler shifts of greater than ± 1% the resultant phase error seriously reduces the signal-to-noise ratio at the output of the detector, thereby degrading the probability of correct detection. With this method no unmodulated synchronous signal is used.

Referring to FIG. 1, the hybrid tracking loop detector system 21 of the present invention accurately demodulates short or long PSK messages when the frequency and phase are not known at the receiver. These PSK messages or signals are of the type generally shown in FIG. 4 and more specifically shown as signal 1 in FIGS. 1 and 2A. Referring to FIG. 1, signal 1 is received by the input of band pass filter 23 the output of which is applied to the input of frequency doubler 25, to the input of phase comparator 26 and to input terminal 29 of three input terminal selector switch 31. Selector switch 31 includes input terminals 29, 33 and 35, output terminal 37 and switching element or arm 39. Output terminal 37 of selector switch 31 is connected to one input of phase comparator 41. The output of phase comparator 41 is connected to the input of amplifier 43 the output of which is connected to the input of adjustable filter 45. The output of adjustable filter 45 is connected to the input of voltage controlled oscillator 47, the output of which is connected to the input of divide by 2 circuit 51, to the input of 90° phase shifter 53 and to input terminals 55 and 57 of three input terminal selector switch 59. Selector switch 59 includes input terminals 55, 57 and 61, output terminal 63 and switching element or arm 65. Output terminal 63 of selector switch 59 is connected to the other input of phase comparator 41. The output of 90° phase shifter 53 is connected to input terminal 35 of selector switch 31 and to one input of phase comparator 27. The output of frequency doubler 25 is connected to input terminal 33 of selector switch 31, to the other input of phase comparator 27 and to one input of lock sense circuit 67. As illustrated by the dotted lines lock sense circuit 67 is connected to arms 39 and 65 of selector switches 31 and 59 respectively and will simultaneously move those arms so that arm 39 will sequentially contact input terminals 29, 33 and 35 and arm 65 will sequentially contact input terminals 61, 57 and 55 respectively on command of lock sense circuit 57 as hereinafter described in detail. Lock sense circuit will also adjust adjustable filter 45 on command as illustrated by dotted lines and as will be hereinafter described in detail. For purpose of illustration and explanation, these functions are performed and described by mechanical switches and dotted lines. However, these functions are actually performed electronically, the details of which are shown and described with respect to FIG. 5.

The output of divide by 2 circuit 51 is applied to input terminal 61 of selector switch 59 and to the input of 90° phase shifter 69. The output of 90° phase shifter 69 is connected to the other input of phase comparator 26, the output of which is connected to the input of low pass filter 71. The output of low pass filter 71 is connected to the input of voltage comparator 73, the output of which is connected to the input of one bit delay line 75 and to one input of exclusive OR gate 77. The output of one bit delay line 75 is connected to the other input of exclusive OR gate 77 the output of which provides the demodulated PSK signal in the desired digital format.

Operation

The operation of detector system 21 of FIG. 1 will now be described by reference to the signal diagram of FIGS. 2A and 2B. It should be noted that the incoming signal 1 is illustrated as an ideal signal. This is done for purpose of illustration and clarity and it is to be understood that the phase shifts are normally somewhat distorted as in the hereinafter described signal 2. In some parts of the following discussion it will be assumed for clarity of description and understanding that output signal 2 of band pass filter 23 will have the same ideal configuration as the illustrated incoming signal 1. That is, phase shifts are immediate. In areas where it is necessary to consider the actual configurations, where phase shifts are not immediate as shown by signals 2 and 3 of FIG. 2A, then reference to this condition will be made in the discussion.

The output signal 2 of band pass filter 23 is applied to one input of phase comparator 26 and to one input of phase comparator 41, through terminal 29 in the switch position shown, which is then processed by amplifier 43, adjustable filter 45 and voltage controlled oscillator 47. With the exception of adjustable filter 45, it is to be understood that phase comparator 41, amplifier 43, adjustable filter 45 (a narrow band filter is conventional) and voltage controlled oscillator 47 together comprise a conventional phase locked loop. Therefore, the operation of this conventional phase locked loop will not be described in detail. However, it should be noted that the output signal 4 of the phase locked loop is twice the carrier frequency $f_c$ (illustrated as $2f_c$) and is a square wave signal as illustrated in FIG. 2A. Signal 4 is applied to divide by 2 circuit 51 which results in a square wave signal 5 having the same frequency and is shifted 90° in phase as compared to signal 1. It should be noted that a phase locked loop inherently causes a 90° phase shift between the two input signals, signals 2 and 5, to the phase comparator 41 when in the locked condition.

It should be noted that the output signal 4 could be a 90° phase shifted signal at the carrier frequency $f_c$ and then directly applied to the other input (connected to terminal 63) of phase comparator 41. However, in the embodiment shown it is necessary to employ a doubled carrier frequency $2f_c$ for application to the input of 90° phase shifter 53 to correspond with $2f_c$ signal applied to phase comparator 27. Therefore, the output of voltage controlled oscillator 47 is applied to divide by 2 circuit 51 which is actually part of the phase locked loop. It should be noted that various different multiples of the carrier frequency may be employed provided they are converted to the same frequency when compared in phase.

Referring to FIG. 2A, when signal 5 has the same frequency and is phase shifted 90° with respect to signal 2, then the phase locked loop is in the locked condition and will remain locked until there is a phase shift. It should be noted that output signal 3 of frequency doubler 25 does not shift in phase when signals 1 and 2 shift in phase such as during the first bit of FIG. 2A. This operational characteristic of the frequency doubler is conventional and will therefore not be described in detail.

It is now necessary for detector system 21 to know that it is locked. This is achieved by shifting the phase of signal 4 by 90° by phase shifter 53 which provides an output signal 6. This 90° phase shifted signal 6 is compared in phase comparator 27 to signal 3 which is the output of frequency doubler 25. If signals 3 and 6 are in phase, as shown in FIG. 2A, then phase comparator 27 provides a large output signal as shown by curve 7 of FIG. 2B. If there is sufficient input signal to allow phase lock this signal 7 will remain high during all phase shifts since twice the carrier frequency $f_c$ is always being compared. If there is not sufficient input signal (the signal to noise ratio being too low for example, or no PSK signal is being received) then signal 7 will go to a lower value or zero.

When signal 7 is at the low or zero value then lock sense circuit 67 causes switches 31 and 59 to be in the position illustrated in order to achieve the above described phase locked condition. After this phase locked condition is achieved then signal 7 goes high and causes switches 31 and 59 to move to the intermediate positions. When switches 31 and 59 are in this intermediate position then the phase locked loop will maintain lock by maintaining signal 4 locked on signal 3.

The system 21 is now ready to demodulate the incoming phase shifted PSK signal. In the demodulation process signal 5 is shifted 90° in phase by phase shifter 69 and results in signal 8. Signal 8 is then compared in phase to signal 2 in phase comparator 26. When in phase the output signal 9 will be high and when 180° out of phase, such as when the successive bits of the PSK signal are shifted in phase, then the signal 9 is low as shown in FIG. 2B. Filter 71 functions to filter high frequency noise and therefore its output signal 9¹ will be similar to signal 9. At this point the signal 1 is demolulated as represented by signal 9. However, further signal processing is desired. The function of voltage comparator 73 is to convert the demodulated signal 9¹ into a square wave demodulated signal 10. This is achieved by setting the DC reference signal of voltage comparator 73 at a value $V_1$ as shown on curve 9 of FIG. 2B. The output of voltage comparator 73 is applied to the input of one bit delay line 75 which provides an output signal 11. This output signal is shifted seven carrier frequency cycles and is applied to one input of exclusive OR gate 77. The other input to exclusive OR gate is signal 10. Exclusive OR gate 77 functions to provide a high output signal when the inputs disagree and provides a low output signal when the inputs agree. This is illustrated by curve 12 of FIG. 2B. The signal 12 is the demodulated PSK signal in the digital format of 1's and 0's.

It should be noted that in actual operation, when there is a phase shift, that the amplitude of signals 2 and 3 will attenuate and noise may introduce error into the phase locked loop system. Therefore, lock sense circuit 67 senses when the peak level of signal 3 is less than $V_2$, as shown in FIG. 2A, and causes switches 31 and 59 to temporarily move to their most upward positions. When in their uppermost positions then signals 4 and 6 are applied to the input of phase comparator 41. These two signals must be 90° out of phase, therefore providing a locked condition, since signal 6 is derived from signal 4 and is shifted 90° by 90° phase shifter 53. This may be considered as temporary memory and has proved to be very effective in preventing cycle slipping or loss of lock. This can only be a very temporary condition since normally there will be frequency drift in the phase lock loop. This temporary memory is only very short, and is limited to about three cycles of the carrier frequency $f_c$. When signal 3 reaches or is greater than the voltage $V_2$ then the switches 31 and 59 will return to the intermediate positions as determined by signal 7. In FIG. 2A it can be seen that the switches were in the upper positions for only about 2 cycles of operation or about 26 microseconds when signal 3 is at 150 KHz or signal 1 is at 75KHz.

Lock sense circuit 67 also functions to vary the bandwidth of the phase locked loop by varying the bandwidth of adjustable filter 45. That is, when switches 31 and 59 are in the lower most position then the bandwidth is selected to be sufficiently wide to pass doppler shifted signals. However, when the switches are in the intermediate or uppermost positions then the bandwidth is selected to be narrower to improve the detection of incoming signal 1 having a low signal-to-noise ratio. This is possible because the wide band is no longer necessary since the system has already locked onto the doppler shifted carrier signal.

In FIG. 5 is schematically illustrated the details of the switching circuits 31 and 59, the lock sense circuit 67, and the adjustable filter 45. The particular detailed design of the various gates, inverters, timers, filters and the like in FIG. 5 are conventional and will therefore not be described in detail. The particular design requirements of these various elements will depend upon the selected carrier frequency $f_c$, the voltage amplification, the current levels and the signal-to-noise ratios involved. However, with a 75KHz carrier frequency it will be apparent to those skilled in the art that high speed solid state components will be required.

In order to provide a convenient comparison between the functional diagram of FIGS. 2A and 2B and the design diagram of FIG. 5, gates 101, 103, 105, 107, 109 and 111 are from top to bottom equivalent to terminals 35, 33, 29, 55, 57 and 61 from top to bottom respectively. For example, gate 105, when turned on, functions the same as switch 31 when in the position shown in FIGS. 2A and 2B. Moreover, the various input signals, designated by circled numbers, represent the same signals in FIGS. 1, 2 and 5. In the various gates, the gating or switching inputs are denoted by the reference character G. The input and output terminals are not noted on the gates since they will be obvious from the arrows, from the denoted signals, and from the previous and following descriptions.

Referring to FIGS. 1 and 5, the outputs of gates 101, 103, and 105 are applied to one input of phase comparator 41 and the outputs of gates 107, 109 and 111 are applied to the other input of phase comparator 41. Referring to FIGS. 1, 2A, 2B and 5, inverter 113 will invert the zero level input signal 7 to a positive level signal which will turn on gates 105 and 111 prior to the system locking onto the carrier signal $f_c$. This is the search mode of operation where the phase comparator 41 will be able to receive and compare signals 2 and 5. In addition, during the search mode of operation, variable filter circuit 45 is selected for broadband operation which is desirable when the carrier frequency $f_c$ may have a substantial doppler shift which would not pass through a narrow band operation. Therefore, signal 7 is also applied through inverter 115 to the gate input of gate 117 which allows the output of amplifier 43 to be applied to the input of broadband filter 119 of variable filter 45. It should be noted that during this search mode of operation that gate 121 is turned off, signal 7 being zero, and therefore the output of amplifier 43 is not applied through narrow band filter 123 of variable filter 45. FIGS. 2A and 2B do not show the signals during the search mode of operation which occurs prior in time to the FIGS. 2A and 2B diagram. However, during the search mode of operation, signals 1 through 7 will be initially very weak and then get stronger until the zero time position of FIGS. 2A and 2B is attained. After the incoming signal 1 has been received and processed the phase locked loop (in the search mode including phase comparator 41, amplifier 43, broadband filter 119, voltage control oscillator 47 and divide by 2 circuit 51) then the system will lock as previous described. When the system locks then signal 7 will become positive as previously described. When signal 7 becomes positive, gates 111 and 105 will turn off and gates 109 and 103 will turn on. Gate 125 will be on, and therefore transmit signal 7 to the gate inputs of gates 109 and 103, when the lock condition is attained for reasons which will be hereinafter explained. Therefore, signal 4 will be compared against signal 3 by phase comparator 41 as described and for reasons previously explained. In addition, gate 121 will turn on and gate 117 will turn off. Therefore, after the system has locked onto the carrier frequency signal 1 ($f_c$) then only the narrow band filter 123 will process the incoming signal which will allow detection of low signal-to-noise ratio signals. This condition of the gates will remain until there is a phase shift.

Referring to FIGS. 1 and 2A, when there is a phase shift, signals 2 and 3 will start attenuating, by the inherent characteristics of band pass filter 23 and frequency doubler 25. As they progressively attenuate, the phase locked loop will frequently slip and go out of lock. Referring to FIGS. 1, 2A and 5, this is prevented by the present invention by applying signal 3 to the input of averaging circuit 127 the output of which is applied to the input of a bias level inverter 129 which is set to provide an output signal when the input is less than the selected bias voltage $V_2$. Bias level inverter 129 will provide no output signal when the input signal is greater than the bias level. The average value of signal 3 of FIGS. 2A and 5 during a phase shift is shown by the diagram associated with the output of averaging circuit 127 of FIG. 5. The output of bias level inverter 129 is connected to the input of a 3 cycle timer gate 131 the output of which is connected to the input of inverter 133 and to the gate inputs of gates 107 and 101. Therefore, when there is a phase shift and signal 3 attenuates below an average value of $V_2$, then gates 107 and 101 are turned on and the internally generated signals 4 and 6 are compared by comparator 41 and the phase locked loop will remain locked and not slip. It should also be noted when gates 107 and 101 are turned on, that gates 109 and 103 will be turned off. This is because, when signal 3 attenuates below $V_2$, inverter 133 will provide no output and gate 125 will be turned off and therefore signal 7, which is on, will not be applied to the gate inputs of gates 109 and 103. This inserting of false or memory pulses by gates 107 and 101 to phase comparator 41 can be only a very temporary condition because voltage controlled oscillator 47 will drift as previously explained. This temporary memory or signal insertion process is time limited by timer gate 131. In this particular embodiment the timer gate 131 was selected for 3 cycles of 75 KHz operation or about 39 microseconds. This timer gate 131 can be any of many different types and can be selected for different time durations depending on such factors as the expected signal-to-noise ratios, the drift characteristics of voltage controlled oscillator 47, and the frequency of operations. The timer of gate 131 is turned on by the output pulse from bias level inverter 129 being applied to its gate input G and will turn off internally by a conventional time delay circuit.

In view of the foregoing, it can be seen that a highly effective detection system for phase shift keyed signals is provided that is effective for the detection of incoming signals having a low signal-to-noise ratio and is capable of locking onto incoming signals that have substantial doppler shift. It should be noted that the above described system has been simplified for purpose of illustration and understanding. For example, in actual practice the output of the voltage controlled oscillator may be a much larger multiple of the incoming carrier frequency $f_c$. For example, in one operational embodiment the output of voltage controlled oscillator 47 was selected to be $32 f_c$. In this case the divide by 2 circuit 51 was a divide by 32 circuit and frequency doubler 25 multiplied the $f_c$ frequency by 32. However, it would be very difficult to show these higher frequency multiples in the timing diagram of FIGS. 2A and 2B and therefore the minimum multiple of 2 was used for purpose of description. It should be noted, however, that a preselected even integer multiple is necessary in order to have proper circuit operation. That is, to be able to inset the memory cycles it is necessary to have this multiple of the carrier frequency $f_c$ for use by the previously described 90° phase shifter 53, phase comparator 27, lock sense circuit 67 and the associated switching elements of switches 31 and 59.

What is claimed is:
1. A detector for detecting phase shift keyed signals including a carrier signal having a frequency $f_c$ comprising:
   a. receiver means for receiving said phase shift keyed signals;
   b. a phase locked loop means for locking onto said carrier signal;
   c. the output of said receiver means connected to the input of said phase locked loop means;
   d. control means;
   e. said control means operably connected to said receiver means and said phase locked loop means for selecting one or more of a plurality of input signals to be applied to said phase locked loop means in response to the output of said receiver means and the output of said phase locked loop means.
2. The detector of claim 1 wherein:
   a. during the search mode of operation where said carrier signal has not been received and locked upon by said phase locked loop means said control means selects a first control position that applies the incoming carrier signal directly to one input of said phase locked loop means and the output of said phase locked loop means to the other input of said phase locked loop means.
3. The detector of claim 2 wherein:
   a. during said search mode of operation said first control position of said control means selects a broadband filter means in said phase locked loop means for processing said incoming carrier signal prior to and until said carrier signal is being received and is locked upon by said phase locked loop means.

4. The detector of claim 2 wherein:
a. after said phase locked loop means has locked upon said carrier frequency and is in the locked mode of operation said control means selects a second control position that applies an integer multiple of the frequency of said incoming carrier signal to said one input of said phase locked loop means and an even integer multiple of the frequency of said output of said phase locked loop means to the other input of said phase locked loop means.

5. The detector of claim 4 wherein:
a. during said locked mode of operation said second control position of said control means selects a narrow band filter means in said phase locked loop means for processing said incoming carrier signal.

6. The detector of claim 4 wherein:
a. after said phase locked loop means has locked upon said carrier frequency and said control means is in said second control position and there is a phase shift in said phase shift keyed signal, said control means detects said phase shift and selects a third control position that applies said even integer multiple of the frequency of said output of said phase locked looped means to said other input of said phase locked loop means and a 90° phase shifted signal of said even integer multiple of the frequency of said output of said phase locked looped means to said one input of said phase locked loop means for a predetermined period of time.

7. The detector of claim 1 wherein:
a. said receiver means includes a band pass filter and a frequency multiplier connected in series;
b. said phase locked loop means includes a first phase comparator, an amplifier, an adjustable filter, a voltage controlled oscillator and a divide circuit connected in series; wherein:
c. said frequency multiplier has an integer multiplier that is the same as the integer divider of said divide circuit.

8. The detector of claim 7 wherein:
a. said control means includes a 90° phase shifter, a second phase comparator, a lock sense circuit and a plurality of switching elements;
b. the output of said voltage controlled oscillator being connected to the input of said 90° phase shifter, the output of which is connected to the input of said second phase comparator and a first of said switching elements, and the output of said second phase comparator connected to the input of said lock sense circuit.

9. The detector of claim 8 wherein:
a. said plurality of switching elements including first, second, third, fourth, fifth and sixth switching elements;
b. the outputs of said first, second, and third switching elements being connected to a first input of said first phase comparator and the outputs of said fourth, fifth and sixth switching elements being connected to a second input of said first phase comparator;
c. said lock sense circuit including first means for detecting when said second phase comparator provides no output signal and second means for detecting when said second phase comparator provides an output signal;
d. the output of said first means connected to the gate inputs of said third and sixth switching elements; and
e. the output of said second means connected to the gate inputs of said second and fifth switching elements.

10. The detector of claim 9 wherein:
a. said lock sense circuit includes third means for detecting when said phase shift keyed signal shifts in phase; and
b. the output of said third means connected to the gate inputs of said first and fourth switching elements.

* * * * *